United States Patent
Wu et al.

(10) Patent No.: US 8,542,157 B2
(45) Date of Patent: Sep. 24, 2013

(54) ANTENNA MODULE

(75) Inventors: Wei-Yang Wu, Taoyuan County (TW);
Chien-Hua Ma, Taoyuan County (TW);
Yen-Chuan Lin, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 319 days.

(21) Appl. No.: 13/092,985

(22) Filed: Apr. 25, 2011

(65) Prior Publication Data
US 2012/0075160 A1 Mar. 29, 2012

(30) Foreign Application Priority Data
Sep. 28, 2010 (TW) ................................ 99132801 A

(51) Int. Cl.
*H01Q 1/50* (2006.01)
(52) U.S. Cl.
USPC ............................ 343/850; 343/860; 343/861
(58) Field of Classification Search
USPC ........................................ 343/850, 860, 861
See application file for complete search history.

(56) References Cited

U.S. PATENT DOCUMENTS

| 7,501,959 B2 * | 3/2009 | Shirakawa | .................... 340/671 |
|---|---|---|---|
| 2004/0009754 A1 | 1/2004 | Smith, Jr. | |
| 2005/0225494 A1 | 10/2005 | Bae | |
| 2006/0094458 A1 | 5/2006 | Kitaji | |
| 2007/0010217 A1 | 1/2007 | Takahashi et al. | |
| 2008/0122723 A1 | 5/2008 | Rofougaran | |
| 2008/0280570 A1 | 11/2008 | Blin | |

FOREIGN PATENT DOCUMENTS

| CN | 101153906 A | 4/2008 |
|---|---|---|
| CN | 101331685 A | 12/2008 |
| CN | 201298234 Y | 8/2009 |
| CN | 101835250 A | 9/2010 |

OTHER PUBLICATIONS

European Search Report.

* cited by examiner

*Primary Examiner* — Kristy A Haupt
(74) *Attorney, Agent, or Firm* — CKC & Partners Co., Ltd.

(57) ABSTRACT

An antenna module includes an antenna, a tunable matching circuit, a power detector and a control unit. The antenna comprises a feeding point. The tunable matching circuit, electrically connected between the antenna and the power detector and configured to provide a loading impedance, comprises a plurality of tunable impedance elements connected to each other and electrically connected to the feeding point as well. The power detector is electrically connected between the tunable matching circuit and a power amplifier and configured to detect a power indicator. The control unit, electrically connected to the tunable matching circuit and the power detector, is configured to read the power indicator and RSSI to generate a control signal for the tunable matching circuit, which consistently changes the loading impedance to achieve impedance matching.

12 Claims, 2 Drawing Sheets

ANTENNA MODULE

RELATED APPLICATIONS

This application claims priority to Taiwan Application Serial Number 099132801, filed Sep. 28, 2010, which is herein incorporated by reference.

FIELD OF INVENTION

The present invention relates to an antenna module. More particularly, the present invention relates to an antenna module that can dynamically adjust the loading impedance.

DESCRIPTION OF RELATED ART

Due to rapid development in information technology, applications on electronic devices have become more complex and are able to do more things. Therefore electronic devices such as 3G cellular phone, electronic paper display etc. have been frequently used in our daily life. This not only provides increased convenience and efficiency, but also causes the compression of time and space, where the culture and information exchange is becoming more frequent than ever before so as to achieve the optimal welfare for all mankind. Accordingly, the antenna plays an important role in communication and transportation technology applications, spreading the messages and knowledge more conveniently.

As the evolution of the communication product is to be smaller and shorter, the exact height of the antenna is determined by the height of the product, resulting in a demand for the minimum size design. However, an antenna with such design is easily affected by the environment factors. For example, when a user uses a communication product with small size antenna to communicate with a person, hands and head of the user generates a masking effect for electromagnetic wave transmitting or absorb some of the electromagnetic power to change the electromagnetic power distribution range. On the other hand, if the radiation element or the current path of the small size antenna is touched by hands of a user, a unmatched loading impedance and current path change are generated, which will result in the operating frequency being shifted to affect the communication quality.

SUMMARY

This present invention provides an antenna module that is configured to read the power indicator and RSSI and perform an Optimization Algorithm calculating so as to dynamically adjust the loading impedance of a tunable matching circuit to achieve impedance matching.

The present invention provides an antenna module which includes an antenna, a tunable matching circuit, a power detector and a control unit. The antenna comprises a feeding point. The tunable matching circuit, electrically connected between the antenna and the power detector and configured to provide a loading impedance, comprises a plurality of tunable impedance elements connected to each other and electrically connected to the feeding point as well. The power detector is electrically connected between the tunable matching circuit and a power amplifier and configured to detect a power indicator. The control unit, electrically connected to the tunable matching circuit and the power detector, is configured to read the power indicator and RSSI so as to generate a control signal for the tunable matching circuit, which consistently changes the loading impedance to achieve impedance matching.

In an embodiment, the tunable impedance elements are tunable capacitors.

In an embodiment, the tunable impedance elements are tunable inductors.

In an embodiment, the tunable impedance elements are tunable capacitors and inductors.

In an embodiment, the antenna module further comprises a coupler, wherein the power detector uses the coupler to detect the power indicator of power amplifier.

In an embodiment, the control unit includes a micro processor electrically connected to the CPU and the power detector.

In an embodiment, the micro processor reads the RSSI from the CPU.

In an embodiment, the micro processor reads the power indicator from the power detector.

In an embodiment, the micro processor calculates a value of the tunable impedance element based on the RSSI and the power indicator.

In an embodiment, the control unit further comprises a control circuit electrically connected to the micro processor and the tunable matching circuit.

In an embodiment, the control circuit generates a control signal for the tunable matching circuit based on a value to change the impedance of the tunable impedance elements.

In an embodiment, the control unit further comprises a calculating module. The calculating module is a Newton's Algorithm calculating module, a Genetic Algorithm calculating module or an Artificial Neural Network Techniques calculating module.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
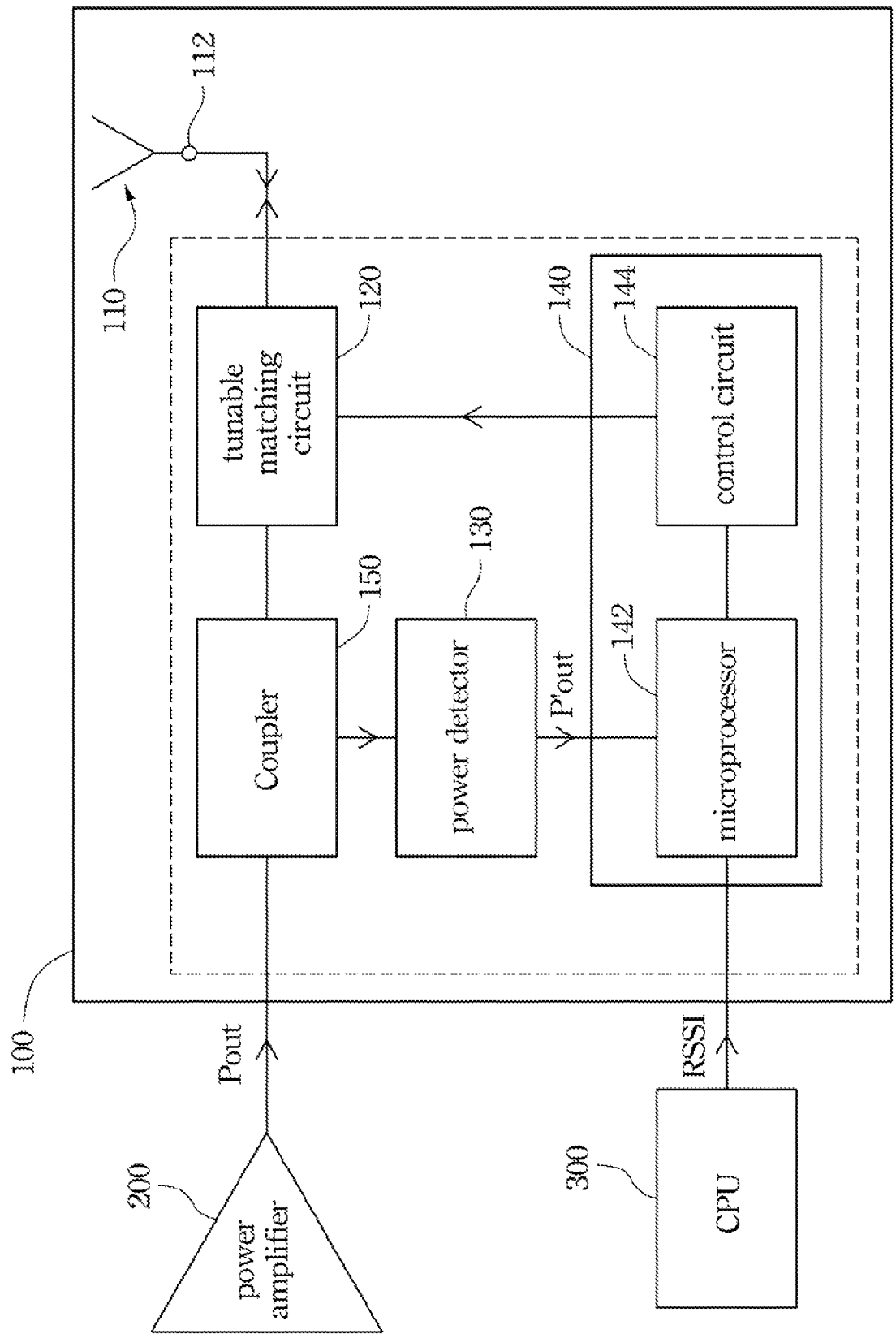
FIG. 1 illustrates a schematic diagram of an antenna module according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
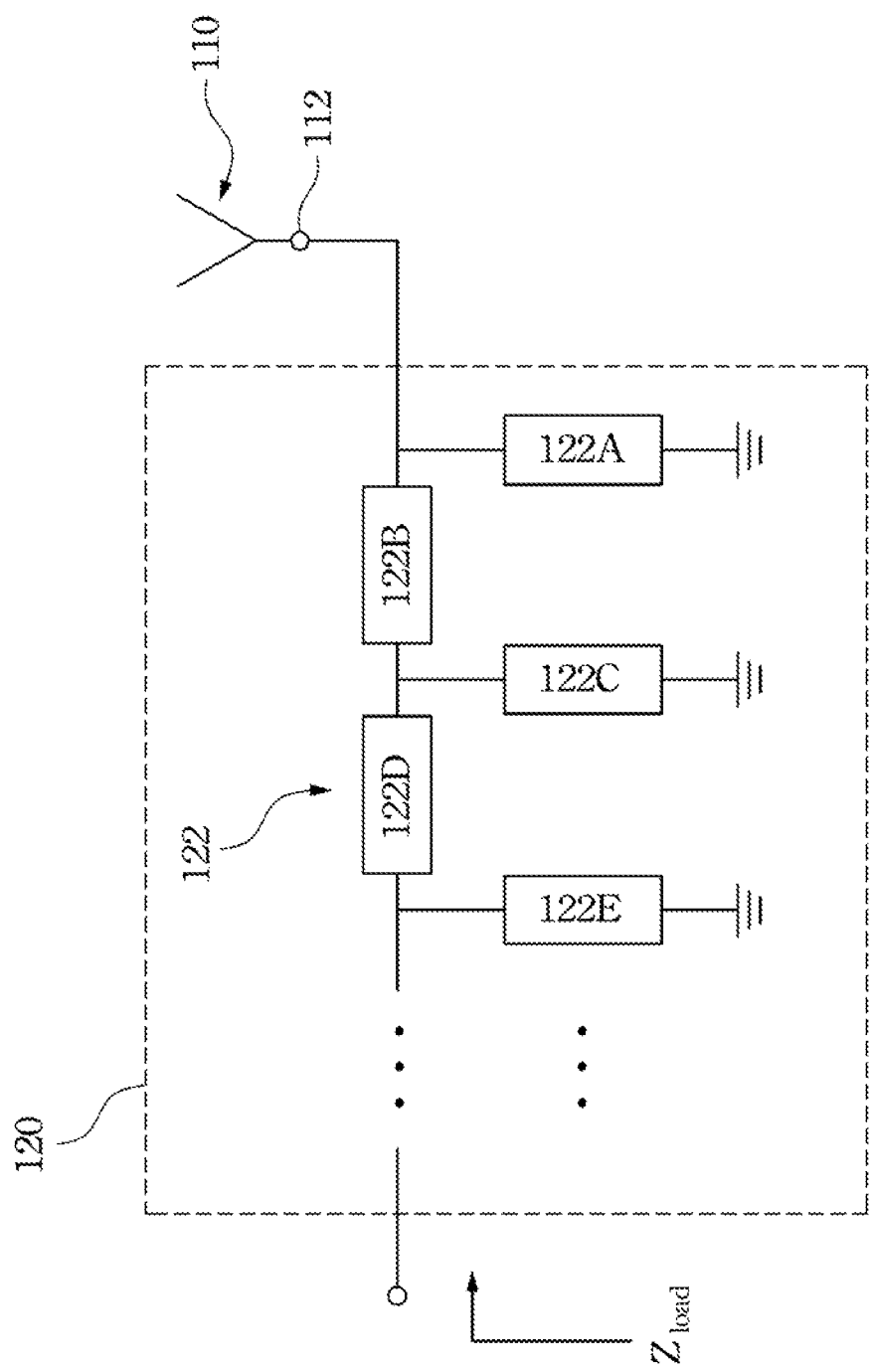
FIG. 2 illustrates a schematic diagram of a tunable matching circuit according to an embodiment of the present invention.

Please refer to FIG. 1 and FIG. 2. FIG. 1 illustrates a schematic diagram of an antenna module according to an embodiment of the present invention. FIG. 2 illustrates a schematic diagram of a tunable matching circuit according to an embodiment of the present invention. The antenna module 100 includes an antenna 110, a tunable matching circuit 120, a power detector 130 and a control unit 140.

The antenna 110 comprises a feeding point 112. The tunable matching circuit 120 is electrically connected between the antenna 110 and a power amplifier (PA) 200 and configured to provide a loading impedance. The tunable matching circuit 120 comprises a plurality of tunable impedance elements 122 connected to each other and electrically connected to the feeding point 112 as well. The power detector 130 is electrically connected between the tunable matching circuit 120 and a power amplifier 200 and configured to detect a power indicator. The control unit 140 is electrically connected to the tunable matching circuit 120 and the power detector 130 and is configured to read the power indicator and receiver signal strength indicator, RSSI, so as to generate a control signal for the tunable matching circuit 120, which consistently changes the loading impedance to achieve impedance matching.

The antenna module 100 further comprises a coupler 150. Because of the load-pull characteristic of the power amplifier 200, the matching situation of the loading impedance ($Z_{load}$) will affect the output power ($P_{out}$) of the power amplifier 200. Therefore, a coupler 150 is used to sample the power so that the power detector 130 can generate a power indicator ($P'_{out}$) to indicate the output power of the power amplifier 200. Accordingly, an equation representing the relationship between the power indicator ($P'_{out}$) and the output power is illustrated in the following.

$$P'_{out}(Z_{load}) = w \times P_{out}(Z_{load})$$

W is a ration of the power indicator ($P'_{out}$) to the output power.

On the other hand, when the antenna module 100 receives the wireless signal, the signal strength of the wireless signal is notified to the CPU 300 to generate a receiver signal strength indicator, RSSI. The matching situation of the loading impedance ($Z_{load}$) will affect the RSSI. That is, the RSSI is a function of the loading impedance ($Z_{load}$). The RSSI can be represented as RSSI($Z_{load}$)

In an embodiment, the control unit 140 includes a micro processor 142 electrically connected to the CPU 300 and the power detector 130. Therefore, the micro processor 142 reads the RSSI from the CPU 300. Moreover, the micro processor 142 also reads the power indicator ($P'_{out}$) from the power detector 130.

Next, the micro processor 142 calculates a communication quality function CQ based on the RSSI and the power indicator. The larger the communication quality function CQ is, the better the communication quality of the antenna module has. The equation of the communication quality function CQ is illustrated in the following:

$$CQ(Z_{load}) = C1 \times P'_{out}(Z_{load}) + C2 \times RSSI(Z_{load})$$

C1 and C2 is the weighted factor and the sum of C1 and C2 is equal to 1.

On the other hand, the micro processor 142 calculates a value of the tunable impedance elements 122 based on an optimization Algorithm to change the loading impedance ($Z_{load}$).

In an embodiment, the control unit 140 further comprises a control circuit 144 electrically connected to the micro processor 142 and the tunable matching circuit 120. The control circuit 144 can read the value calculated by the micro processor 142 to generate a control signal for the tunable matching circuit 120 to change the impedance of the tunable impedance elements 122, which consistently changes the loading impedance ($Z_{load}$).

Accordingly, the tunable matching circuit 120, the power detector 130 and the control unit 140 can form a calculating loop. The calculating loop can continued read the RSSI($Z_{load}$) and the power indicator $P'_{out}(Z_{load})$ to perform an optimization Algorithm calculation to change the loading impedance ($Z_{load}$) to maximize the communication quality function CQ. That is to get a maximum $$CQ(Z_{load}) = C1 \times P'_{out}(Z_{load}) + C2 \times RSSI(Z_{load})$$

In other words, by the loading impedance ($Z_{load}$), the environment influence factors, such as a masking effect because of hands and head of a user affecting the electromagnetic wave transmitting, can be much reduced to maximize the output power and the signal strength of the antenna module 100 to improve the communication quality.

On the other hand, the control unit 140 further comprises a calculating module. In another embodiment, the micro processor 142 serves as the calculating module to perform different Algorithm calculation. For example, the micro processor 142 serves as a Newton's Algorithm calculating module, a Genetic Algorithm calculating module or an Artificial Neural Network Techniques calculating module. Accordingly, an optimized loading impedance ($Z_{load}$) can be got by using a suitable calculation module and the RSSI($Z_{load}$) and the power indicator $P'_{out}(Z_{load})$ FIG. 2 illustrates a schematic diagram of a tunable matching circuit according to an embodiment of the present invention. The tunable matching circuit 120 comprises a plurality of tunable impedance elements 122, such as impedance element 122A, 122B, 122C, 122D, 122E and so on. The loading impedance of the tunable matching circuit 120 is a function of the impedance of the impedance element 122A, 122B, 122C, 122D, 122E and so on, which can be represented as $Z_{load}$(122A,122B,122C,122D,122E, . . . ). It is noticed that the number and the connection structure of the impedance element 122 is changeable based on the requirement of the user. In another embodiment, the tunable impedance elements 122 are tunable capacitors, tunable inductors or tunable capacitors and inductors connected in series. The tunable impedance elements 122 is electrically connected to the feeding point 112 to provide the loading impedance.

Accordingly, the loading impedance ($Z_{load}$) can be adjusted automatically by using a suitable calculation module and the RSSI($Z_{load}$) and the power indicator $P'_{out}(Z_{load})$. Therefore, the environment influence factors can be much reduced to maximize the output power and the signal strength of the antenna module to improve the communication quality.

Although the present invention has been described in considerable detail with reference to certain embodiments thereof, other embodiments are possible. Therefore, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An antenna module, comprising:
   an antenna with a feeding point;
   a tunable matching circuit electrically connected between the antenna and a power amplifier and configured to provide a loading impedance, wherein the tunable matching circuit comprises a plurality of tunable impedance elements connected to each other and electrically connected to the feeding point as well;
   a power detector electrically connected between the tunable matching circuit and the power amplifier and configured to detect a power indicator; and
   a control unit electrically connected to the tunable matching circuit and the power detector and configured to read the power indicator and a receiver signal strength indicator so as to generate a control signal for the tunable matching circuit, which consistently changes the loading impedance to achieve impedance matching, wherein the power indicator and the receiver signal strength indicator forms a communication quality function CQ, the control signal changes the loading impedance to maximize the communication quality function CQ.

2. The antenna module of claim 1, wherein the tunable impedance elements are tunable capacitors.

3. The antenna module of claim 1, wherein the tunable impedance elements are tunable inductors.

4. The antenna module of claim 1, wherein the tunable impedance elements are tunable capacitors and inductors.

5. The antenna module of claim 1, further comprising a coupler, wherein the power detector uses the coupler to detect the power indicator of the power amplifier.

6. The antenna module of claim 1, wherein the control unit includes a micro processor electrically connected to a CPU and the power detector.

7. The antenna module of claim 6, wherein the micro processor reads the receiver signal strength indicator from the CPU.

8. The antenna module of claim 7, wherein the micro processor reads the power indicator from the power detector.

9. The antenna module of claim 8, wherein the micro processor calculates a value of the tunable impedance elements based on the maximized communication quality function CQ.

10. The antenna module of claim 9, wherein the control unit further comprises a control circuit electrically connected to the micro processor and the tunable matching circuit.

11. The antenna module of claim 10, wherein the control circuit generates the control signal for the tunable matching circuit based on the value to change the impedance of the tunable impedance elements.

12. The antenna module of claim 10, the control unit further comprises a calculating module, wherein the calculating module is a Newton's Algorithm calculating module, a Genetic Algorithm calculating module or an Artificial Neural Network Techniques calculating module.

* * * * *